United States Patent [19]
Yano et al.

[11] Patent Number: 5,232,765
[45] Date of Patent: Aug. 3, 1993

[54] DISTRIBUTED CONSTANT CIRCUIT BOARD USING CERAMIC SUBSTRATE MATERIAL

[75] Inventors: Shinsuke Yano, Nagoya; Hirofumi Yamaguchi, Komaki; Takami Hirai, Aichi, all of Japan

[73] Assignee: NGK Insulators, Ltd., Japan

[21] Appl. No.: 733,642

[22] Filed: Jul. 22, 1991

[30] Foreign Application Priority Data

Jul. 25, 1990 [JP]  Japan .................................. 2-196530

[51] Int. Cl.⁵ .............................................. B32B 3/00
[52] U.S. Cl. .................................. 428/195; 428/209; 428/210; 428/323; 428/325; 428/332; 428/402; 428/432; 428/433; 428/457; 428/901
[58] Field of Search ............... 428/195, 209, 210, 323, 428/325, 332, 402, 432, 433, 457, 901

[56] References Cited

U.S. PATENT DOCUMENTS

| | | | |
|---|---|---|---|
| 4,301,324 | 11/1981 | Kumar et al. | 174/68.5 |
| 4,620,264 | 10/1986 | Ushifusa et al. | 361/414 |
| 4,794,048 | 12/1988 | Oboodi et al. | 428/432 |
| 4,883,705 | 11/1989 | Kawakami et al. | 428/209 |
| 4,899,118 | 2/1990 | Polinski, Sr. | 333/246 |

FOREIGN PATENT DOCUMENTS

| | | |
|---|---|---|
| 51-37655 | 10/1976 | Japan . |
| 54-35678 | 11/1979 | Japan . |
| 56-26321 | 6/1981 | Japan . |
| 58-20905 | 4/1983 | Japan . |
| 59-23048 | 5/1984 | Japan . |

OTHER PUBLICATIONS

Patent Abstracts of Japan vol. 14, No. 242 (C-721), May 23, 1990 & JP-A-2,064,059 (Murata Mfg Co.) Mar. 5, 1990.
IEEE, Proceedings of the 36th. Electronic Components Conference 1986, New York, US pp. 37-47; A. L. Eustice et al.: "Low Temperature Co-firable Ceramics: A New Approach for Electronic Packaging." p. 38, left col., paragraph 2-p. 39, right col., paragraph 2.
World Patents Index Latest Week 8223, Derwent Publications, Ltd., London, GB; AN 82-46708E & JP-A-57,069,607 (Alps Electric Co.) Apr. 28, 1982.

*Primary Examiner*—Patrick J. Ryan
*Assistant Examiner*—Elizabeth Evans
*Attorney, Agent, or Firm*—Parkhurst, Wendel & Rossi

[57] ABSTRACT

A distributed constant circuit board including a ceramic substrate, and at least one conductor pattern which is carried by the ceramic substrate and which forms a resonance circuit, an inductor, a capacitor or strip transmission line. The conductor pattern has an electrically conductive composition whose major component is selected from the group consisting of Ag, Au and Cu, and which has a sheet resistivity not higher than 10 mΩ per square. The conductor is formed by co-firing with the ceramic substrate, so that the conductor pattern is incorporated in the substrate. The ceramic substrate is formed principally of a ceramic composition which gives the resonance circuit a resonance frequency whose temperature coefficient is held within a range between −30 ppm/° C. and +100 ppm/° C.

6 Claims, 2 Drawing Sheets

DISTRIBUTED CONSTANT CIRCUIT BOARD USING CERAMIC SUBSTRATE MATERIAL

BACKGROUND OF THE INVENTION

1. Field of the Invention

The present invention relates in general to a distributed constant circuit board, and more particularly to such a distributed constant circuit board which contains an internal distribution of conductor patterns for a microwave integrated circuit (MIC) and an electric filter, for example.

2. Discussion of the Prior Art

Keeping pace with recent developments of various microwave devices such as mobile telephones and pocket or portable telephones, there has been a growing need for high-quality high-performance electronic components used in such devices. In particular, printed-wiring or -circuit boards for high-frequency circuits or distributed constant circuits, which are used in these electronic components, need to satisfy the following three requirements. First, the distributed constant circuit board should use electric conductors having a comparatively low resistivity, since a high resistivity of the conductors results in reduction in the Q value of a resonance circuit or inductor, and consequent increase in the transmission loss of the conductors. Secondly, the conductors should be distributed in a multi-level or multi-layered structure of the board, to minimize the size of the resultant electronic components. Thirdly, the resonance circuit, inductor and capacitor formed on the distributed constant circuit board should have sufficiently low temperature coefficients, so as to minimize changes of the physical quantities with respect to temperature.

The conventional distributed constant circuit board of the type indicated above uses ceramic substrates or resin substrates for carrying conductor patterns. The resin substrates have known drawbacks such as: difficulty in forming multi-level or multi-layered conductor circuit patterns; comparatively low dielectric constant; and comparatively high temperature coefficient of the dielectric constant. These properties associated with the dielectric constant lead to low operating reliability of the board.

An alumina substrate is known as one kind of ceramic substrate, which has a dielectric constant whose temperature coefficient is relatively high. More specifically, when a resonance circuit is formed using the alumina substrate, the resonance frequency of the circuit has a negative temperature coefficient as low as about −60 ppm/° C. Further, the alumina substrate has a relatively high sintering temperature which limits the choice of the materials usable for the conductor patterns incorporated or buried therein. Namely, the alumina substrate should be used with tungsten, molybdenum and other conductors which have sufficiently high melting point and resistivity. There are also known ceramic substrates formed of forsterite or steatite, which have excellent high-frequency characteristics. However, the dielectric constants of these ceramic materials also have relatively high temperature coefficients. Therefore, the resonance frequency of a resonance circuit formed on these ceramic substrates tends to have a greatly negative temperature coefficient, as in the case where the alumina substrate is used. Further, the high sintering temperatures of forsterite and steatite limit the choice of the materials usable for the multi-level conductors, to tungsten, molybdenum or other conductive materials having a sufficiently high resistivity.

It is also known to use substrates having a relatively low sintering temperature, which are co-fired with multi-level conductors such as Ag or Cu which have a relatively low resistivity. In this case, the co-firing temperature may be lowered below the melting point of the conductors. The thus formed distributed constant circuit board also has a resonance frequency whose temperature coefficient is largely on the negative side.

For fabricating a high-frequency circuit board, it is known to form the substrates of a ceramic material which has a relatively high dielectric constant, such as those containing $BaO\text{-}TiO_2$, $MgO\text{-}CaO\text{-}TiO_2$ or $SnO_2\text{-}ZrO_2\text{-}TiO_2$, for example. These ceramic materials have a comparatively low temperature coefficient, and excellent microwave dielectric characteristics. However, the ceramic substrates have high sintering temperatures and cannot be used for providing multi-level conductors principally made of low-resistance metals such as Ag and Cu which have low melting points.

SUMMARY OF THE INVENTION

The present invention was developed in the light of the prior art situations described above. It is accordingly an object of the invention to provide a distributed constant circuit board, which has low temperature coefficients with respect to the dielectric constant and the resonance frequency of a resonance circuit, and which incorporates circuit pattern conductors having a sufficiently low resistivity. More particularly, the present invention aims at providing a multi-level distributed constant circuit board which contains a resonance circuit, capacitor, an inductor and other electronic circuits having excellent operating characteristics.

The above object may be achieved according to the principle of the present invention, which provides a distributed constant circuit board including a ceramic substrate, and at least one conductor pattern which is carried by said ceramic substrate and which forms a resonance circuit, an inductor, a capacitor or a strip transmission line, wherein the at least one conductor pattern has an electrically conductive composition whose major component is selected from the group consisting of Ag, Au and Cu, and which has a sheet resistivity not higher than 10 mΩ per square, each conductor pattern being formed by co-firing with the ceramic substrate. Further, the ceramic substrate consists principally of a ceramic composition which gives the resonance circuit a resonance frequency whose temperature coefficient is held within a range between −30 ppm/° C. and +100 ppm/° C.

The distributed constant circuit board constructed according to the present invention has at least one conductor pattern including at least one conductor pattern which forms a resonance circuit, an inductor, a capacitor or a strip transmission line, and which is embedded or buried in the ceramic substrate. The conductor pattern is formed of an electrically conductive composition having a relatively low sheet resistivity, whose major component is Ag, Cu or Au, so that the conductor pattern suitably functions as a microwave integrated circuit. Further, the composition for the ceramic substrate is selected so that the temperature coefficient of the resonance frequency of the resonance circuit is held within a range of −30 ppm/° C. to +100 ppm/° C. Therefore, the distributed constant circuit board of the invention finds practical applications, especially in the field of microwave integrated circuitry wherein circuit patterns for resonance circuit, inductor, capacitor and other elements are buried in the ceramic substrate.

According to the present invention, there is provided a circuit board, whose dielectric constant and resonance frequency of the resonance circuit have sufficiently relatively low temperature coefficients, and whose conductor pattern has a sufficiently low sheet resistivity. In particular, the circuit patterns can be formed in a multilevel structure, so that the patterns provide a distributed constant circuitry incorporating a resonance constant, capacitor and/or other elements, which exhibits improved operating characteristics.

Preferably, the ceramic composition contains at least 5% by weight of $TiO_2$ powder whose particles are dispersed within the ceramic substrate. The $TiO_2$ particles contained in the ceramic substrate are effective to adjust the temperature coefficients of the ceramic substrate.

BRIEF DESCRIPTION OF THE DRAWINGS

The above object, features and advantages of the present invention will be better understood by reading the following detailed description of the invention, when considered in connection with the accompanying drawings, in which.

DETAILED DESCRIPTION OF THE INVENTION

Figure 1:
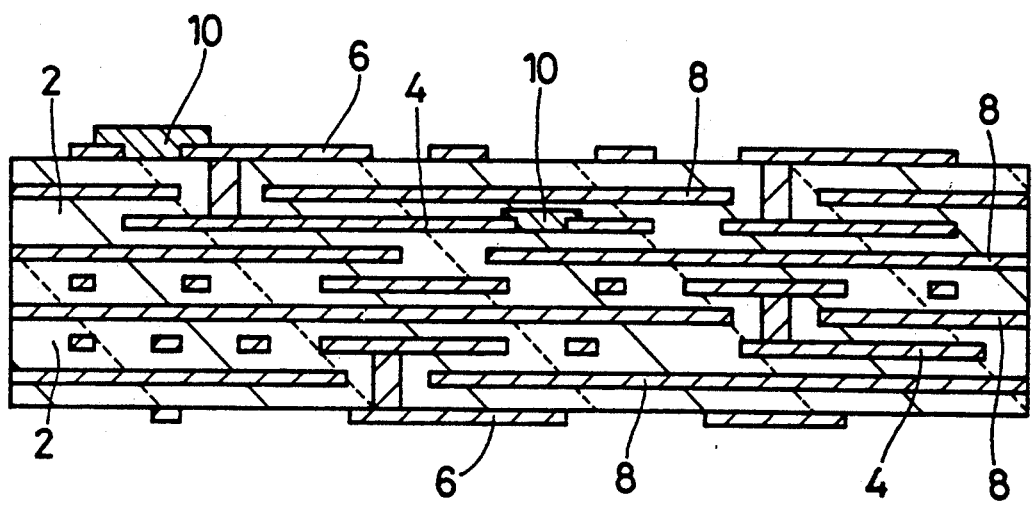
FIG. 1 is an elevational view in cross section of one embodiment of a distributed constant circuit board of the present invention.

In the distributed constant circuit board according to the present invention, the ceramic substrate is formed of a ceramic composition which gives the resonance circuit a resonance frequency whose temperature coefficient falls within a range between $-30$ ppm/° C. and $+100$ ppm/° C. If the ceramic composition is formulated so as to give the temperature coefficient of the resonance frequency lower than $-30$ ppm/° C., the resonance frequency of the resonance circuit actually formed has an excessively high temperature coefficient. If the ceramic composition is formulated so as to give higher than $+100$ ppm/° C. temperature coefficient of the resonance frequency, the capacitor formed on the distributed constant circuit board suffers from an excessively high temperature coefficient.

According to the present invention, the ceramic composition for the ceramic substrate is determined by the temperature coefficient of the resonance frequency of the resonance circuit. If this temperature coefficient is not held within the range specified above, the resonance circuit, the inductor, the capacitor and other elements formed within in the ceramic substrate do not perform their intended functions, and because the temperature coefficients of these elements are represented by the temperature coefficient of the resonance frequency of the resonance circuit. That is, the electronic circuits formed by the conductors carried by the ceramic substrate are practically usable, when the temperature coefficient of the resonance frequency of the resonance circuit ranges from $-30$ ppm/° C. to 100 ppm/° C. The term "resonance circuit" used herein is interpreted to mean, for example, a $\lambda/4$ or $\lambda/2$ triplate type stripline circuit, or a ring type resonator.

Since the ceramic substrate is co-fired with the conductor pattern or patterns made principally of Ag-, Au- or Cu-based metals which have a relatively low resistivity, the sintering temperature of the ceramic composition for the substrate should not be higher than 1100° C., that is, not higher than the melting point of the above-indicated conductor metals. The ceramic composition is either a glass-based composition or non-glass-based composition. The glass-based ceramic composition is principally a mixture of an amorphous or crystallized glass powder having a dielectric constant of not higher than 20, and a $TiO_2$ powder. To the mixture of glass and $TiO_2$ powders, there may be added a filler which serves to adjust the strength and thermal expansion coefficient of the ceramic substrate obtained. The filler may consist of a powder of alumina, mullite, cordierite, forsterite, quartz, quartz glass, zircon, zirconia, or and $RE_2Ti_2O_7$ (RE: rare earth elements such as Nd, Sm, La, Pr and Y), which powder has a dielectric constant of not higher than 50. In many cases, amorphous or crystallized glass having a dielectric constant of not higher than 20 has a resonance frequency whose temperature coefficient is $-30$ ppm/° C. or lower, and may therefore be easily adjusted by the addition of a $TiO_2$ powder whose temperature coefficient is about 450 ppm/° C. The filler does not affect the mixture of the glass and $TiO_2$ powders, since most of the fillers having a dielectric constant of not higher than 50 have resonance frequencies whose temperature coefficient is 100 ppm/° C. or lower.

For the non-glass-based ceramic composition, a $TiO_2$ powder is mixed with boric acid, an oxide of alkaline earth metal and silicic acid, and, if necessary, alumina or other metal oxide, or an oxide of alkali metal. Then, the mixture is calcined, and crushed or ground into a particulate form. Alternatively, the ceramic constituents indicated above except the $TiO_2$ powder are calcined and crushed or ground, and the obtained particulate materials are then mixed with the $TiO_2$ powder to provide the ceramic composition for the ceramic substrate.

Since $TiO_2$ is present in the form of particles in the mass of the other ceramic components for the ceramic substrate, it serves to adjust the temperature coefficient of the dielectric constant of the ceramic substrate, and consequently the temperature coefficient of the resonance frequency of the resonance circuit formed by the conductors carried by the ceramic substrate. $TiO_2$ per se is a ceramic having a temperature coefficient of as high as about 450 ppm/° C. According to the present invention, this relatively high temperature coefficient of $TiO_2$ is utilized as to adjust the temperature coefficient of the ceramic composition for the substrate, by adjusting the amount of the $TiO_2$ powder to be added to the ceramic composition. The temperature coefficient of the ceramic composition is less effectively adjusted if the amount of the $TiO_2$ powder is smaller than 5% by weight. The use of the $TiO_2$ powder is effective to adjust the temperature coefficient of the ceramic composition, due to its considerably high temperature coefficient, and since the $TiO_2$ powder is not used as a compound, but used alone, and is unlikely to be decomposed during firing of the ceramic substrate.

Preferably, the $TiO_2$ powder is introduced into the ceramic composition by mixing the $TiO_2$ powder with the powder mixture of the other components of the ceramic composition prior to firing thereof, or by separating the $TiO_2$ particles from a crystallized glass, for example. It is permissible that a part of the thus introduced $TiO_2$ reacts to a certain extent with the other components of the ceramic composition during the firing, to thereby form a compound such as $SrTiO_3$, $CaTiO_3$, or $MgTiO_3$. However, it is desirable to lower the degree of this reaction of the $TiO_2$ powder so as to restrict the formation of such compounds. For improved sinterability of the ceramic composition, it is also desirable to calcine the $TiO_2$ powder so as to achieve a sufficiently large particle size of the $TiO_2$ powder obtained. For example, the particles of the thus calcined $TiO_2$ power have a BET specific surface area of not larger than about 2 $m^2/g$ determined according to the BET equation (Brunauer-Emmett-Teller equation).

According to the present invention, the ceramic substrate formed of the above-described ceramic composition is co-fired with the conductor patterns forming the resonance circuit, an inductor, a capacitor and/or strip transmission line, for example, which are formed within the substrate, such that the conductor patterns are integral with the ceramic substrate. If the co-fired internal distribution of the conductor patterns has a comparatively sheet high resistivity, the characteristics of the resonance circuit and inductor are deteriorated, and the strip transmission line suffers from an increased transmission loss. Namely, the highly resistive conductor patterns are not suitably used as microwave integrated circuitry. Accordingly, the conductors used in the present invention are required to have a sheet resistance of not higher than 10 $m\Omega$ per square, or a specific resistance (resistivity) of not higher than 10 $\mu\Omega.cm$, which specific resistance is more significant to the microwave integrated circuitry than the sheet resistance. The conductors may be made of an electrically conductive composition whose major component is selected from the group consisting of: Ag; Ag-based alloys such as Ag-Pt, Ag-Pd and Ag-Pt-Pd; Cu; commercially available Cu-based alloys; Au; and Au-based alloys such as Au-Pt, Au-Pd and Au-Pt-Pd. For forming the conductor pattern or patterns on the surface or surfaces of the ceramic substrate, the above electrically conductive composition having the low resistivity as indicated above is applied to the surfaces of the unfired ceramic substrate, and are then co-fired with the ceramic composition. Alternatively, the conductor patterns may be formed on the surfaces of the ceramic substrate after the substrate and the internal conductor patterns embedded or buried therein have been co-fired. For example, such conductor patterns are formed by firing a paste of a Ag-, Cu- or Au-based alloy applied to the surface of the fired substrate by a commonly used thick-film forming process, or the conductor patterns may be formed on the substrate surface by a plating, sputtering or other thin-film forming process.

The distributed constant circuit board of the present invention can be produced in a suitable known manner, by using the ceramic composition and electrically conductive composition as described above. Generally, green sheets are formed of the ceramic composition, and a paste of the electrically conductive composition having a low melting point as indicated above is applied in desired patterns on the ceramic green sheets, by printing or other pattern forming techniques. The thus prepared ceramic green sheets are laminated one on another and compacted together, and the stack of the green sheets with the conductor patterns formed of the paste are then co-fired so that an intended distributed constant circuit board is obtained. Since the low melting-point composition such as Ag-, Au- or Cu-based alloys is used for the conductor patterns of the instant distributed constant circuit board, the co-firing of the substrate and conductor patterns may be effected at a temperature not higher than 1100° C.

Referring to the cross sectional view of FIG. 1, there is shown a distributed constant circuit board constructed according to one embodiment of the present invention. In this figure, reference numeral 2 denotes a ceramic substrate (dielectric ceramic body) made of a ceramic composition which gives a resonance circuit formed by the conductor a resistance frequency whose temperature coefficient is held within a range between −30 ppm/° C. and 100 ppm/° C. Within the body of the ceramic substrate 2 or on the surfaces of the substrate, there are provided various conductor patterns, which include internal conductors 4 embedded or buried in the substrate 2, external conductors 6 formed on the surfaces of the substrate 2, and earth conductors 8 buried in the substrate 2. These conductors 4, 6, 8 are formed in a multi-level fashion and carried by the ceramic substrate 2. The present distributed constant circuit board further includes suitable resistors 10 which are embedded in or formed on the ceramic substrate 2.

The thus constructed distributed constant circuit board uses the ceramic substrate whose dielectric constant and resonance frequency of the resonance circuit have relatively low temperature coefficients. Further, the conductors having relatively low resistivity are co-fired with the ceramic substrate so that most of the conductors are integrally buried within the substrate. Thus, the present invention provides a multi-level or multi-layered distributed constant circuit board having at least one conductor pattern forming a resonance circuit, condenser, an inductor or other electronic components, which have excellent operating characteristics.

EXAMPLES

To further clarify the concept of the present invention, some examples of the invention will be described. It is to be understood that the invention is not limited to the details of the illustrated examples, but may be embodied with various alterations, modifications and improvements, which may occur to those skilled in the art, without departing from the scope of the invention defined in the appended claims.

EXAMPLE 1

A powder prepared by crushing or grinding a commercially available $CaO-SiO_2-Al_2O_3-B_2O_3$ glass, i.e., a so-called E glass, was mixed intimately with commercially available powders of alumina and $TiO_2$, and filler powder, in various proportions as indicated in TABLE 1 below. Thus, various specimens of the ceramic powder mixture were prepared. In an alumina pot mill using alumina balls, the powder mixture of each specimen was mixed well with acrylic organic binder, plasticizer, toluene and alcoholic solvent, to prepare a slurry. Then, the slurry was formed into a plurality of green tapes having a thickness of 0.1 mm ~ 1.0 mm, by doctor-blading technique. Thus, specimens No. 1 through No. 9 as indicated in TABLE 1 of the green tapes having respective ceramic compositions were prepared.

On the other hand, a conductor paste to be printed on the green tapes was prepared by mixing an Ag-based powder, acrylic organic binder and terpineolic organic solvent, by a kneader using three rollers. For preparing resistors, a commercially available resistor paste for thick-film circuits was used.

By using these conductor and resistor pastes, suitable conductive wiring patterns, earth layers and resistors were printed on the appropriate green tapes indicated above. Then, suitable conductor patterns which form a desired resonance circuit of stripline type or ring type and a desired inductor were printed on the green tapes, according to the pattern of a capacitor and the principle of a distributed constant circuit. Thereafter, the green tapes on which these conductor patterns were printed were laminated on each other in a predetermined order, and then compacted at a temperature of 100° C., under a pressure of 100 kg/cm². The thus formed multi-level conductors patterns separated by the green tapes were interconnected through a conductive paste which fills through-holes, which are formed through the individual green tapes by punching, for example.

Subsequently, the stack of ceramic green tapes was heat-treated at 500° C. so as to remove the binder therefrom, and then fired at 900° C. for 30 min., whereby various specimens of a distributed constant circuit board as shown in FIG. 1 was obtained.

On the surfaces of the thus prepared distributed constant circuit board specimens, there were formed conductor and resistor patterns, by using a commercially available thick-film forming Ag/Pt-, Ag/Pd-, or Au-based paste, and commercially available resistor paste, respectively. The conductor and resistor patterns were fired at 850° C. Further, Cu conductor patterns were formed on the substrate surfaces, by using a commercially available Cu conductor paste, and were fired at 600° C.

TABLE 1

| No. | Ceramic substrate composition (% by weight) | | | | | Properties | |
|---|---|---|---|---|---|---|---|
| | E glass | Alumina | TiO$_2$ | Other fillers | | Dielectric constant | $\tau f$ |
| 1 | 73 | 10 | 12 | Mullite | 5 | 9 | −8 |
| 2 | 70 | 10 | 15 | Quartz | 5 | 9 | 8 |
| 3 | 65 | 20 | 15 | — | — | 10 | 6 |
| 4 | 65 | 10 | 25 | — | — | 12 | 42 |
| 5 | 65 | 5 | 30 | — | — | 15 | 60 |
| 6 | 65 | 15 | 15 | Nd$_2$Ti$_2$O$_7$ | 5 | 10 | 0 |
| 7 | 68 | 10 | 12 | Nd$_2$Ti$_2$O$_7$ | 10 | 10 | −15 |
| 8 | 63 | 25 | 12 | — | — | 10 | −7 |
| 9 | 75 | 20 | 5 | — | — | 8 | −30 |
| 10 | 100 | — | — | — | — | 7 | −45 |

Figure 2A:
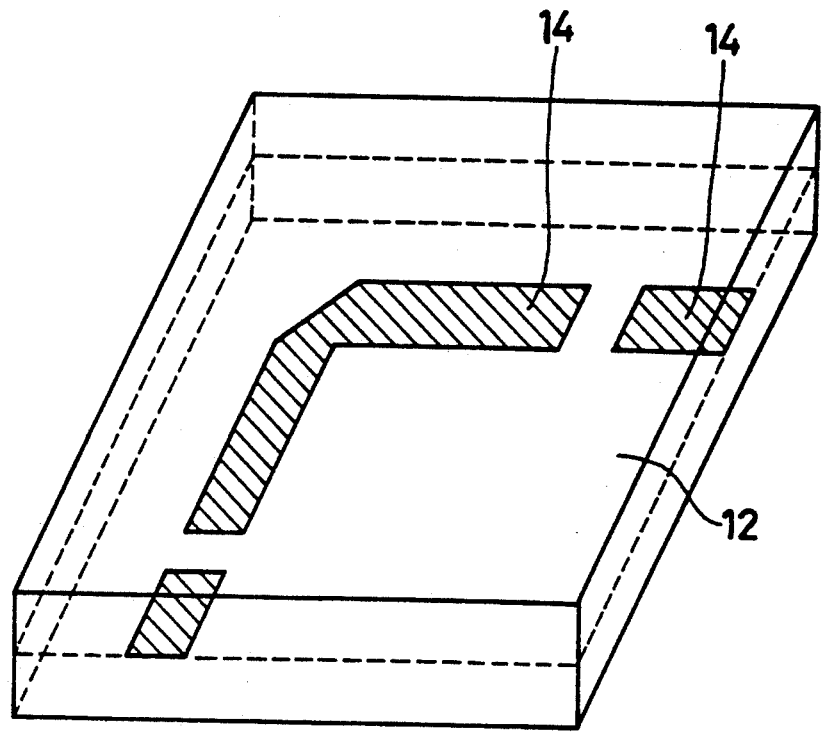
FIG. 2(a) is a perspective view illustrating a ½ wavelength stripline resonator of tri-plate type fabricated according to the invention, whose specimens were subjected to a test to measure the temperature coefficient of the resonance frequency.
Figure 2B:
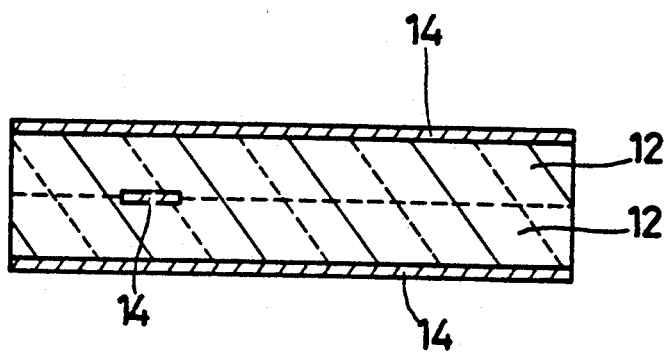
FIG. 2(b) is a cross sectional view of the stripline resonator of FIG. 2(a).

For each of the specimens of the distributed constant circuit board prepared by using the respective ceramic compositions, the dielectric constant, and the temperature coefficient ($\tau f$) of the resonance frequency of the resonance circuit were measured. The result of the measurement is indicated in TABLE 1. The temperature coefficient ($\tau f$) of the resonance frequency was measured with respect to a ½ wavelength stripline resonator of triplate type as shown in FIGS. 2(a) and 2(b). In these figures, reference numeral 12 denotes dielectric ceramics, while reference numeral 14 denotes conductors.

As is apparent from TABLE 1, the distributed constant circuit boards of the specimens Nos. 1~9 according to the present invention are more excellent in terms of their dielectric constant and the temperature coefficient ($\tau f$), than a distributed constant circuit board of a comparative example (No. 10) whose ceramic composition does not include TiO$_2$ to adjust the temperature coefficient.

EXAMPLE 2

A glass powder consisting of 74% by weight of SiO$_2$, 3% by weight of Al$_2$O$_3$, 13% by weight of B$_2$O$_3$, 4% by weight of alkali metal oxide, 5% by weight of PbO and 1% by weight of the balance was prepared. The glass powder was mixed intimately with an alumina powder and a TiO$_2$ powder both of which were commercially available, and with a filler powder, in various proportions as indicated in TABLE 2 below. In an alumina pot mill using alumina balls, each mixture thus obtained was mixed well with acrylic organic binder, plasticizer, toluene and alcoholic solvent, to prepare a slurry. Then, the slurry was formed into a plurality of green tapes in the same manner as in Example 1. Thus, ceramic substrate specimens having respective ceramic compositions were produced. By using these specimens, a corresponding number of distributed constant circuit boards with internal conductors were obtained in the same manner as in Example 1. External conductors formed on the surfaces of each distributed constant circuit board specimen were prepared from a conductor paste which was obtained by mixing Ag-based powder, Pd powder, acrylic organic binder and terpineolic organic solvent, by a kneader using three rollers. The conductor paste was applied by printing to the surfaces of the distributed constant circuit board, and then co-fired with the distributed constant circuit board which contains the internal conductors embedded.

The thus obtained distributed constant circuit board specimens were tested for their properties, i.e., the dielectric constant and the temperature coefficient ($\tau f$) of the resonance frequency of the resonance circuit thereof. The result of the test is indicated in TABLE 2, together with the ceramic compositions of the ceramic substrates.

In TABLE 2, the specimens No. 11~No. 15 were produced according to the present invention, while the

TABLE 2

| No. | Ceramic substrate composition (% by weight) | | | | | Properties | |
|---|---|---|---|---|---|---|---|
| | glass | Alumina | TiO$_2$ | Other fillers | | Dielectric constant | $\tau f$ |
| 11 | 80 | — | 20 | — | — | 7 | 15 |
| 12 | 55 | 30 | 15 | — | — | 7 | 2 |
| 13 | 65 | 10 | 15 | forsterite | 10 | 6 | 0 |
| 14 | 60 | 10 | 30 | — | — | 12 | 55 |
| 15 | 73 | 20 | 7 | — | — | 6 | −28 |
| 16 | 100 | — | — | — | — | 5 | −50 | specimen No. 16 is a comparative example wherein TiO$_2$ is not contained in the ceramic substrate.

EXAMPLE 3

A glass powder composed of 18% by weight of MgO, 37% by weight of Al$_2$O$_3$, 37% by weight of SiO$_2$, 5% by weight of B$_2$O$_3$, and 3% by weight of the balance was prepared. The glass powder was mixed intimately with an alumina powder and a TiO$_2$ powder both of which were commercially available, and with a filler powder, in various proportions as indicated in TABLE 3. In an alumina pot mill using alumina balls, each mixture thus obtained was mixed well with an acrylic organic binder, plasticizer, toluene and alcoholic solvent, to prepare a slurry. Then, the slurry was formed into a plurality of green tapes in the same manner as in Example 1. Thus, ceramic substrate specimens having the respective ceramic compositions were produced. By using these specimens, corresponding distributed constant circuit board specimens with internal conductors were obtained in the same manner as in Example 1. External conductors were formed on the surfaces of each distributed constant circuit board specimen in the following manner. Namely, after the surfaces of the ceramic substrate was subjected to acid treatment, a Cu film was formed over the entire area of the substrate surface, by Cu electroless plating or electrolytic plating. A film of resin resist was formed on the Cu film, and was formed in a suitable pattern by photolithographic technique.

TABLE 3

| No. | Ceramic substrate composition (% by weight) | | | | Properties | |
|---|---|---|---|---|---|---|
| | glass | Alumina | TiO$_2$ | Other fillers | Dielectric constant | τf |
| 17 | 73 | — | 17 | Nd$_2$Ti$_2$O$_7$ 10 | 9 | 14 |
| 18 | 80 | — | 15 | — | 7 | 10 |
| 19 | 80 | 5 | 15 | — | 7 | 11 |
| 20 | 80 | — | 20 | — | 8 | 29 |
| 21 | 75 | — | 25 | — | 9 | 46 |
| 22 | 85 | 10 | 5 | — | 6 | −27 |
| 23 | 100 | — | — | — | 6 | −42 |

Then, the Cu film was subjected to etching through the resin resist, whereby desired Cu conductor patterns were formed on the substrate surface.

The thus obtained distributed constant circuit board specimens having the respective ceramic substrates have properties as indicated in TABLE 3

In TABLE 3, the specimens No. 17 through No. 22 were produced according to the present invention, while the specimen No. 23 is a comparative example wherein the ceramic substrate does not contain TiO$_2$.

EXAMPLE 4

A ceramic powder was prepared by mixing SiO$_2$, H$_3$CO$_4$, Li$_2$CO$_3$, CaCO$_3$ and MgCO$_3$ in predetermined amounts, calcining the mixture at 900° C., and grinding the calcined mixture. The ceramic powder was then mixed with a commercially available TiO$_2$ powder, such that the ceramic substrate to be eventually obtained was composed of 40% by weight of SiO$_2$, 18% by weight of B$_2$O$_3$, 2% by weight of Li$_2$O, 10% by weight of CaO, 5% by weight of MgO, and 15% by weight of TiO$_2$.

In an alumina pot mill using alumina balls, the mixture of the ceramic powder and TiO$_2$ powder was mixed well with acrylic organic binder, plasticizer, toluene and alcoholic solvent, to prepare a slurry. Then, the slurry was formed into a plurality of green tapes according to the method of Example 1, and a distributed constant circuit board having internal conductors was produced by using the green tapes. External conductors were also formed according to the method of Example 1. The thus produced distributed constant circuit board had a dielectric constant of 8, and a resonance frequency whose temperature coefficient was 5 ppm/° C.

What is claimed is:

1. A distributed constant circuit board, comprising:
a ceramic substrate consisting essentially of a ceramic composition including at least 5% by weight of TiO$_2$ powder, wherein particles of said TiO$_2$ powder are dispersed in said ceramic substrate; and
a microwave integrated circuit buried in said ceramic substrate, said microwave integrated circuit forming at least one of a resonance circuit, an inductor, a capacitor and a strip transmission line and having a major component selected from the group consisting of Ag, Au and Cu, said microwave integrated circuit having a sheet resistivity not higher than 10 mΩ per square; wherein
said ceramic composition of said ceramic substrate yields a temperature coefficient between −30 ppm/° C. and +100 ppm/° C. of such a resonance circuit, said microwave integrated circuit is co-fired with a green sheet of said ceramic substrate, and a sintering temperature of the ceramic substrate is not higher than 1100° C.

2. A distributed constant circuit board of claim 1, wherein said TiO$_2$ powder is calcined so as to give a BET specific surface area not larger than 2 m$^2$/g.

3. A distributed constant circuit board of claim 1, wherein said ceramic composition comprises a mixture of an amorphous or crystallized glass powder and said TiO$_2$ powder, said amorphous or crystallized glass powder having a dielectric constant not higher than 20.

4. A distributed constant circuit board according to claim 3, wherein said ceramic composition further comprises a filler in the form of a powder selected from the group consisting of: alumina; mullite; cordierite, forsterite; quartz; quartz glass; zircon; zirconia; and RE$_2$Ti$_2$O$_7$ wherein RE is one or more rare earth elements, said filler having a dielectric constant not higher than 50.

5. A distributed constant circuit board of claim 1, wherein said ceramic composition comprises a mixture of a TiO$_2$ powder, and said ceramic material selected from the group consisting of: boric acid; an oxide of alkaline earth metal; and silicic acid.

6. A distributed constant circuit board of claim 1, wherein said major component of said microwave integrated circuit is selected from the group consisting of: Ag; Ag-Pt alloy; Ag-Pd alloy; Ag-Pt-Pd alloy; Cu; Cu-based alloy; Au; Au-Pt alloy; Au-Pd alloy; and Au-Pt-Pd alloy.

* * * * *